(12) United States Patent
Long

(10) Patent No.: US 11,204,532 B2
(45) Date of Patent: Dec. 21, 2021

(54) WIRING STRUCTURE, DISPLAY SUBSTRATE, DISPLAY DEVICE AND METHOD FOR FABRICATING DISPLAY SUBSTRATE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 13 days.

(21) Appl. No.: 16/642,544

(22) PCT Filed: Aug. 9, 2019

(86) PCT No.: PCT/CN2019/099960
§ 371 (c)(1),
(2) Date: Feb. 27, 2020

(87) PCT Pub. No.: WO2020/048291
PCT Pub. Date: Mar. 12, 2020

(65) Prior Publication Data
US 2021/0149261 A1 May 20, 2021

(30) Foreign Application Priority Data

Sep. 6, 2018 (CN) .......................... 201821460536.1

(51) Int. Cl.
*G02F 1/1362* (2006.01)
*H01L 27/12* (2006.01)

(52) U.S. Cl.
CPC ...... *G02F 1/136286* (2013.01); *H01L 27/124* (2013.01); *H01L 27/127* (2013.01); *H01L 27/1222* (2013.01); *H01L 27/1237* (2013.01)

(58) Field of Classification Search
CPC ........... G02F 1/136286; H01L 27/1222; H01L 27/1237; H01L 27/124; H01L 27/127
USPC ................................................... 349/149–152
See application file for complete search history.

(56) References Cited

U.S. PATENT DOCUMENTS

| 2002/0141232 | A1 | 10/2002 | Saito et al. |
| 2009/0086143 | A1* | 4/2009 | Kaneko ............. G02F 1/136204 349/139 |
| 2019/0096911 | A1 | 3/2019 | Li et al. |

FOREIGN PATENT DOCUMENTS

| CN | 1920647 A | 2/2007 |
| CN | 104614910 A | 5/2015 |
| CN | 106952940 A | 7/2017 |
| CN | 207148492 U | 3/2018 |

(Continued)

*Primary Examiner* — Charles S Chang
(74) *Attorney, Agent, or Firm* — Myers Bigel, P.A.

(57) ABSTRACT

A wiring structure includes a plurality of signal lines on the base substrate, the plurality of signal lines including a plurality of first type signal lines extending in a first direction and a second type signal line extending in a second direction crossing the first direction, the second type signal line being at first ends of the plurality of first type signal lines and spaced from the plurality of first type signal lines, and a plurality of conductive blocks, each of which is between the first ends of two corresponding adjacent signal lines of the plurality of first type signal lines. The plurality of conductive blocks are insulated from the plurality of first type signal lines and electrically connected to the second type signal line.

17 Claims, 8 Drawing Sheets

(56) References Cited

FOREIGN PATENT DOCUMENTS

CN 208570607 U 3/2019

\* cited by examiner

WIRING STRUCTURE, DISPLAY SUBSTRATE, DISPLAY DEVICE AND METHOD FOR FABRICATING DISPLAY SUBSTRATE

RELATED APPLICATIONS

The present application is a 35 U.S.C. 371 national stage application of a PCT International Application No. PCT/CN2019/099960, filed on Aug. 9, 2019, which claims the benefit of Chinese Patent Application No. 201821460536.1, filed on Sep. 6, 2018 to the China National Intellectual Property Administration, the entire disclosures of which are incorporated herein by reference.

TECHNICAL FIELD

The present disclosure relates to the field of display technologies, and particularly to a wiring structure, a display substrate, and a display device.

BACKGROUND

A display substrate (for example, an array substrate on which a pixel array is formed) includes a display area and a frame area surrounding the display area. A plurality of display signal lines (such as gate lines and/or data lines) are provided in the display area, and the display signal lines may be connected to respective peripheral connection lines. The peripheral signal lines are usually provided in the frame area to receive a scanning signal or data signal from the peripheral circuits.

In the case of high resolution and narrow frames, the display signal lines in the display area and the peripheral connection lines in the frame area are densely arranged together, which easily causes signal crosstalk between adjacent lines, so that the corresponding display signal lines receive an inaccurate scanning signal or data signal. This may cause poor display of the display device.

SUMMARY

According to some embodiments of the present disclosure, a wiring structure is provided, which comprises: a plurality of signal lines on the base substrate, the plurality of signal lines comprising a plurality of first type signal lines extending in a first direction and a second type signal line extending in a second direction crossing the first direction, the second type signal line being at first ends of the plurality of first type signal lines and spaced from the plurality of first type signal lines; and a plurality of conductive blocks, each of which is between the first ends of two corresponding adjacent signal lines of the plurality of first type signal lines. The plurality of conductive blocks are insulated from the plurality of first type signal lines and electrically connected to the second type signal line.

In some embodiments, the plurality of first type signal lines, the second type signal line, and the plurality of conductive blocks are in a same layer. In some embodiments, the plurality of conductive blocks are directly connected to the second type signal line.

In some embodiments, the wiring structure further comprises: a plurality of peripheral connection lines on a side of the second type signal line facing away from the base substrate; and an insulating layer between the plurality of peripheral connection lines and the first type signal lines and the second type signal line. The plurality of peripheral connection lines are connected to corresponding first ends of the plurality of first type signal lines through corresponding via holes in the insulating layer.

In some embodiments, the wiring structure further comprises: a plurality of conductive connection lines at the same layer as the plurality of peripheral connection lines. The plurality of conductive connection lines are connected to the second type signal line and the plurality of conductive blocks through corresponding via holes in the insulating layer.

In some embodiments, the wiring structure further comprises: a first insulating layer between the plurality of first type signal lines and the second type signal line. The plurality of conductive blocks are in the same layer as the plurality of first type signal lines.

In some embodiments, the wiring structure further comprises: a plurality of peripheral connection lines on a side of the first insulating layer facing away from the base substrate. The plurality of peripheral connection lines are connected to corresponding first ends of the plurality of first type signal lines.

In some embodiments, the plurality of peripheral connection lines are at the same layer as the plurality of first type signal lines and are directly connected to the plurality of first type signal lines.

In some embodiments, the plurality of conductive blocks are connected to the second type signal line through corresponding via holes in the first insulating layer.

In some embodiments, the wiring structure further comprises: a second insulating layer between the plurality of peripheral connection lines and the first insulating layer; and a plurality of conductive connection lines at the same layer as the plurality of peripheral connection lines. The plurality of peripheral connection lines are connected to corresponding first ends of the plurality of first type signal lines through corresponding via holes in the second insulating layer. One end of each of the plurality of conductive connection lines is connected to a corresponding one of the plurality of conductive blocks through a corresponding via hole penetrating through the second insulating layer, and the other end of each conductive connection line is connected to the second type signal line through corresponding via holes penetrating through the first insulating layer and the second insulating layer.

In some embodiments, the plurality of signal lines further comprise a plurality of third type signal lines that cross the plurality of first type signal lines and are insulated from the plurality of first type signal lines. The plurality of third type signal lines are at the same layer as the plurality of peripheral connection lines.

In some embodiments, the second type signal line comprises a signal line trunk extending along the second direction and a plurality of branch portions symmetrical with respect to the signal line trunk. An orthographic projection of each of the plurality of peripheral connection lines on the base substrate is between orthographic projections of adjacent two corresponding branch portions in the second direction of the plurality of branch portions on the base substrate.

In some embodiments, each of the plurality of branch portions has a first size in the second direction, each of the plurality of peripheral connection lines has a second size in the second direction, and the first size is larger than the second size.

In some embodiments, the plurality of peripheral connection lines and the plurality of conductive connection lines are parallel to the plurality of first type signal lines.

In some embodiments, the plurality of first type signal lines, the second type signal line, and the plurality of conductive blocks are made of at least one selected from a group consisting of an aluminum film, a copper film, a molybdenum film, a titanium film, a chromium film, an aluminum neodymium alloy film, and an aluminum nickel alloy film.

According to some embodiments of the present disclosure, a display substrate comprising a base substrate and the wiring structure as described above is provided.

In some embodiments, the plurality of first type signal lines are selected from a group consisting of gate lines and data lines. The second type signal line is selected from a group consisting of a common electrode line, a clock signal line, a positive voltage signal line, a negative voltage signal line, and an auxiliary discharge line.

According to some embodiments of the present disclosure, a display device comprising the display substrate as described above is provided.

According to some embodiments of the present disclosure, a method for fabricating the display substrate as described above is provided. The display substrate further comprises a bottom-gate thin film transistor, and the bottom-gate thin film transistor comprises a gate, a gate insulating layer, an active layer, and a source and a drain. The method comprising: patterning a first layer of metal thin film on the base substrate to form the plurality of first type signal lines and the gate in a display area of the display substrate, and to form the second type signal line and the plurality of conductive blocks in a frame area of the display substrate; forming the gate insulating layer on the base substrate and the patterned first layer of metal thin film; forming the active layer on a portion of the gate insulating layer opposite to the gate; and patterning a second layer of metal thin film on a portion of the gate insulating layer that is not covered by the active layer and a side of the active layer facing away from the gate insulating layer to form the source and the drain in the display area, and electrically connecting the plurality of conductive blocks to the second type signal line.

According to some embodiments of the present disclosure, a method for fabricating the display substrate as described above is provided. The display substrate further comprises a top-gate thin film transistor, and the top-gate thin film transistor comprises a gate, a gate insulating layer, an active layer, and a source and a drain. The method comprising: forming a buffer layer and the active layer on the base substrate, wherein the active layer is stacked on the buffer layer; forming the gate insulating layer on a portion of the buffer layer that is not covered by the active layer and a side of the active layer facing away from the buffer layer; patterning a first layer of metal thin film on a side of the gate insulating layer facing away from the base substrate to form the gate and the plurality of first type signal lines in a display area of the display substrate, and to form the second type signal line and the plurality of conductive blocks in a frame area of the display substrate; forming an interlayer insulating layer on the gate insulating layer; and patterning a second layer of metal thin film on the interlayer insulating layer to form the source and the drain in the display area, and electrically connecting the plurality of conductive blocks to the second type signal line.

BRIEF DESCRIPTION OF THE DRAWINGS

In the following description of exemplary embodiments in conjunction with the accompanying drawings, more details, features and advantages of the present disclosure are disclosed. In the drawings.

DETAILED DESCRIPTION OF EMBODIMENTS

Figure 1:
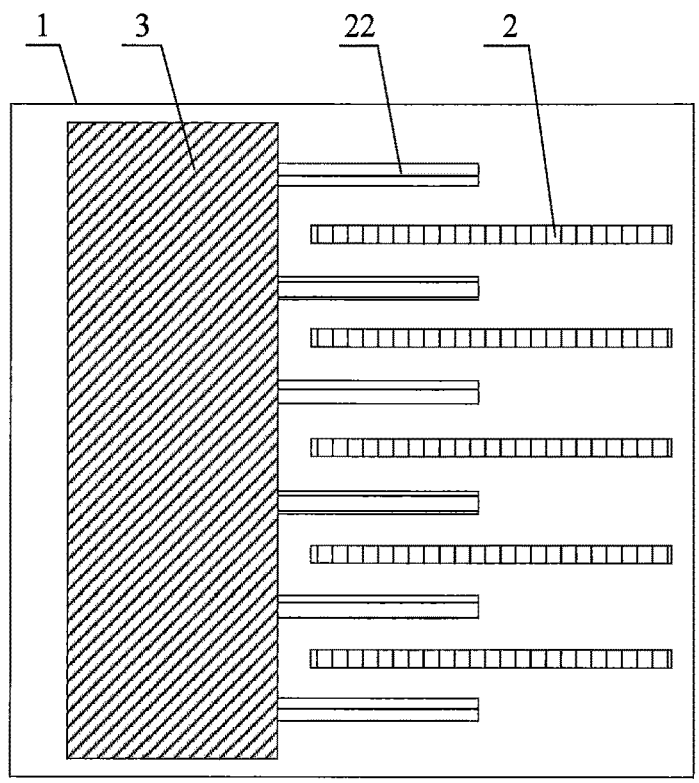
FIG. 1 is a schematic plan view of a wiring structure according to an embodiment of the present disclosure.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below may be termed as a second element, component, region, layer or section without departing from the teachings of the present disclosure.

Spatially relative terms such as "below", "under", "lower", "underneath", "over", "upper", etc. may be used herein for ease of description to describe the relationship between one element or feature and another element(s) or feature(s) as illustrated in the figure. It will be understood that these spatially relative terms are intended to encompass different orientations of the devices in use or operation in addition to the orientation depicted in the figures. For example, if the device in the figures is turned over, elements described as "under other elements or features" or "below other elements or features" or "underneath other elements or features" would then be oriented "over other elements or features". Thus, the exemplary terms "under" and "below" may encompass both orientations over and below. Terms such as "before" or "in front of" and "after" or "in the back of" may similarly be used, for example, to indicate the order in which light passes through some elements. The device may be oriented otherwise (rotated 90 degrees or at other orientations) and the spatially relative descriptors used herein are interpreted accordingly. In addition, it will also be understood that when a layer is referred to as being "between two layers", it may be the only layer between the two layers, or one or more intervening layers may also be present.

The terminology used herein is for the purpose of describing particular embodiments only and is not intended to limit the disclosure. As used herein, the singular forms "a", "an", and "the" are intended to include the plural forms as well, unless the context clearly indicates otherwise. It will be further understood that the terms "including" and/or "comprising" when used in this description specify an existence of stated features, integers, steps, operations, elements and/or components, but do not exclude an existence of one or more other features, integers, steps, operations, elements, components, and/or groups thereof or an addition of one or more other features, integers, steps, operations, elements, components, and/or groups thereof. As used herein, the term "and/or" includes any and all combinations of one or more of the associated listed items.

It will be understood that when an element or layer is referred to as being "on another element or layer", "connected to another element or layer", "coupled to another element or layer", or "adjacent to another element or layer", it may be directly on another element or layer, directly connected to another element or layer, directly coupled to another element or layer, or directly adjacent to another element or layer, or there may be an intermediate element or layer. In contrast, when an element is referred to as being "directly on another element or layer", "directly connected to another element or layer", "directly coupled to another element or layer", or "directly adjacent to another element or layer", no intermediate elements or layers exist. However, under no circumstances should "on" or "directly on" be construed as requiring one layer to completely cover the layers below.

Embodiments of the present disclosure are described herein with reference to schematic illustrations (and intermediate structures) of idealized embodiments of the present disclosure. Because of this, variations in the shapes of the illustrations should be expected, for example, as a result of fabricating techniques and/or tolerances. Therefore, the embodiments of the present disclosure should not be interpreted as being limited to the specific shape of the regions illustrated herein, but should include, for example, shape deviations due to fabricating. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms such as those defined in commonly used dictionaries should be interpreted to have meanings consistent with their meanings in the relevant field and/or context of this description, and will not be explained in an idealized or too formal sense, unless explicitly defined as such herein.

FIG. 1 is a schematic plan view of a wiring structure according to an embodiment of the present disclosure. Referring to FIG. 1, a wiring structure is formed on a base substrate 1 and includes a plurality of first type signal lines 2, at least one second type signal line 3, and a plurality of conductive blocks 22.

The plurality of first type signal lines 2 extend in a first direction (a horizontal direction in this example). In some embodiments, the first type signal line 2 may be, for example, a gate line or a data line.

The second type signal line 3 extends in a second direction (in this example, a vertical direction) crossing the first direction. The second type signal line 3 is at first ends (the left ends in this example) of the plurality of first type signal lines 2 and is spaced apart from the plurality of first type signal lines 2. In some embodiments, the second type signal line 3 may be, for example, one of a common electrode line, a clock signal line, a positive voltage signal line, a negative voltage signal line, or an auxiliary discharge line.

Each of the plurality of conductive blocks 22 is between the first ends of two corresponding adjacent signal lines in the plurality of first type signal lines 2. The plurality of conductive blocks 22 are insulated from the plurality of first type signal lines 2 and electrically connected to the second type signal line 3.

The first type signal lines 2, the second type signal line 3, and the conductive blocks 22 may be made of the same type of conductive materials or different types of conductive materials. Each of the conductive materials is usually a metal material with a small resistance value. Exemplarily, the first type signal lines 2, the second type signal line 3, and the conductive blocks 22 may be made of at least one selected from a group consisting of aluminum film, copper film, molybdenum film, titanium film, chromium film, aluminum-neodymium alloy film, and aluminum-nickel alloy film. That is, the first type signal lines 2, the second type signal line 3, and the conductive blocks 22 may be a single-layer metal thin film such as aluminum film, copper film, molybdenum film, titanium film, chromium film, aluminum-neodymium alloy film, or aluminum-nickel alloy film, and may also be a multilayer metal thin film formed by stacking at least two selected from a group consisting of aluminum film, copper film, molybdenum film, titanium film, chromium film, aluminum-neodymium alloy film, and aluminum-nickel alloy film.

By providing a conductive block 22 that is insulated from the first type signal lines 2 and electrically connected to the second type signal line 3 between the first ends of each two adjacent first type signal lines 2, a shielded line is provided between each two adjacent first type signal lines 2, and the shielded line may reduce signal crosstalk between respective adjacent first type signal lines 2. In the application of a display substrate, this potentially improves the display effect. In addition, the plurality of first type signal lines 2 and the second type signal line 3 extend in a crossing direction, which may improve the utilization rate of the wiring space on the base substrate 1.

Figure 2:
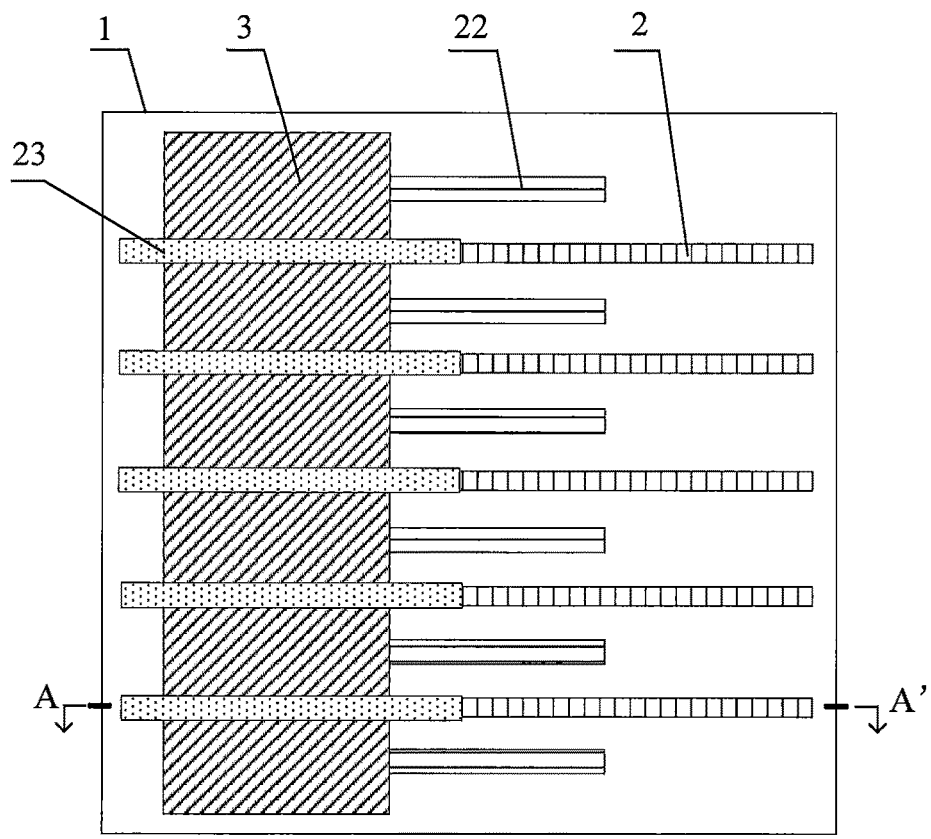
FIG. 2 is a schematic plan view of another wiring structure according to an embodiment of the present disclosure.
Figure 3:
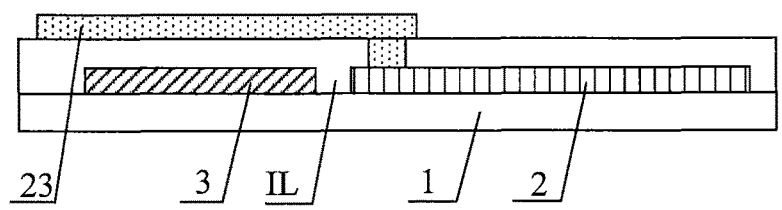
FIG. 3 is a schematic sectional view taken along a line A-A' in FIG. 2.

FIGS. 2 and 3 schematically illustrate another wiring structure according to an embodiment of the present disclosure. Referring to FIGS. 2 and 3, the wiring structure further includes a plurality of peripheral connection lines 23 and an insulating layer IL.

The peripheral connection lines 23 are on a side of the second type signal line 3 facing away from the base substrate 1. The insulating layer IL is between the peripheral connection lines 23 and the first type signal lines 2 and the type signal line 3. The peripheral connection lines 23 are connected to corresponding first ends of the first type signal lines 2 through corresponding via holes in the insulating layer IL. Each of the peripheral connection lines 23 may be used to transmit a signal (for example, a scanning signal or a data voltage) from an external circuit (not shown) to the corresponding first type signal line 2.

The conductive blocks 22 and the second type signal line 3 may be disposed at the same layer, so that they may be directly connected, as shown in FIG. 2. Of course, other embodiments are also contemplated.

Figure 4:
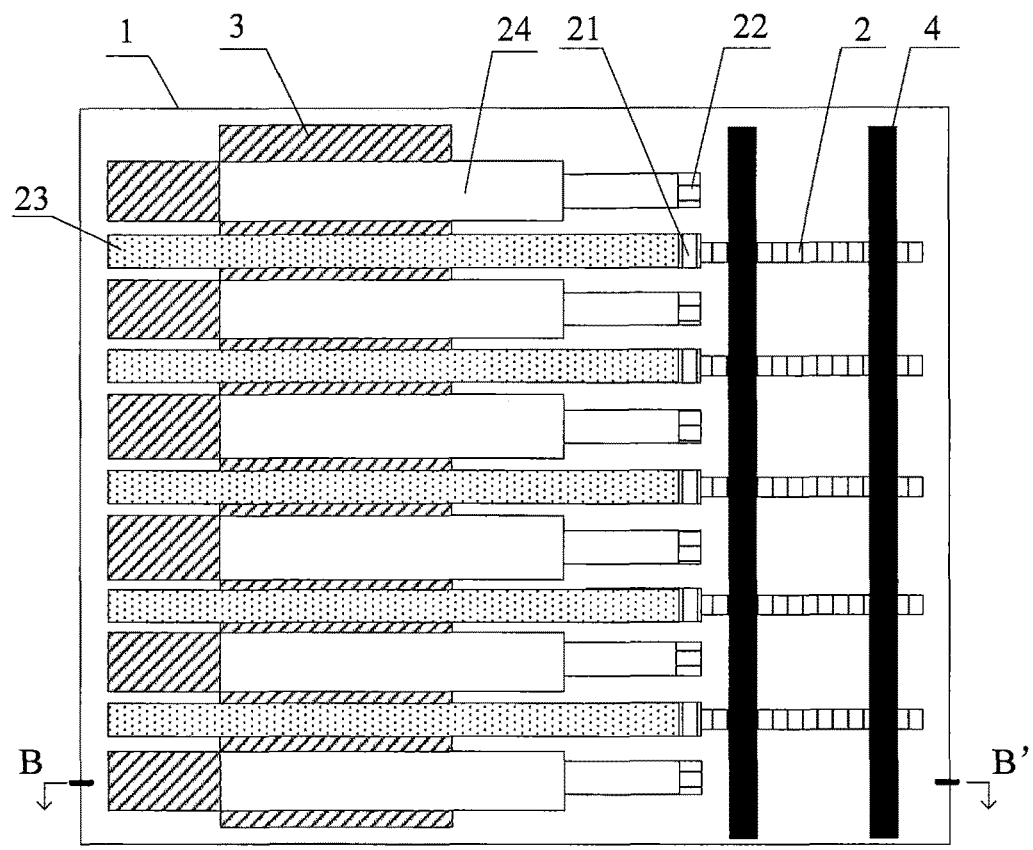
FIG. 4 is a schematic plan view of another wiring structure according to an embodiment of the present disclosure.
Figure 5:
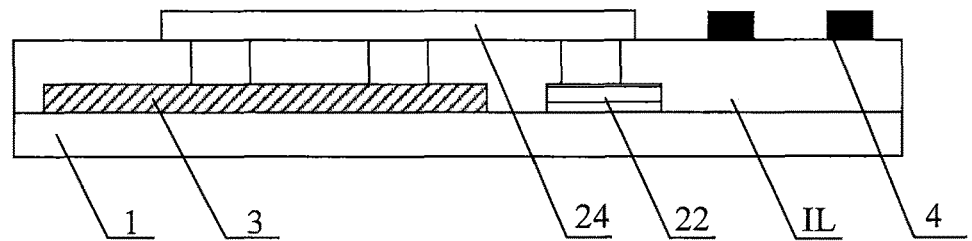
FIG. 5 is a schematic sectional view taken along a line B-B' in FIG. 4.

FIGS. 4 and 5 schematically illustrate another wiring structure according to an embodiment of the present disclosure. Referring to FIGS. 4 and 5, the conductive blocks 22 and the second type signal line 3 are at the same layer but spaced apart from each other, and the plurality of conductive connection lines 24 are provided at the same layer as the peripheral connection lines 23, that is, on the side of the insulating layer IL facing away from the base substrate 1. The conductive connection lines 24 are connected to the second type signal line 3 and the conductive blocks 22 through corresponding via holes in the insulating layer IL. As shown in FIG. 4, a conductive connection line 24 connecting the corresponding conductive block 22 and the second type signal line 3 is provided between each two adjacent peripheral connection lines 23. The conductive connection line 24 functions as a signal shielding line, thereby reducing signal crosstalk between adjacent peripheral connection lines 23.

In some embodiments, as shown in FIG. 4, the first ends of the first type signal lines 2 are provided with connection blocks 21 through which the peripheral connection lines 23 are connected to the corresponding first type signal lines 2. The connection blocks 21 may have, for example, a rectangular shape, and the connection blocks 21 and the conductive blocks 22 are equally spaced. This facilitates uniform lithography, to ensure that the edges of each rectangular block have a high etching uniformity, thereby improving the accuracy and the production yield of the wiring structure.

FIGS. 4 and 5 also show a plurality of third type signal lines 4 crossing the first type signal lines 2 and insulated from the first type signal lines 2. In the embodiment where the first type signal lines 2 are gate lines, the third type signal lines 4 may be data lines. In the embodiment where the first type signal lines 2 are data lines, the third type signal lines 4 may be gate lines. The third type signal lines 4 may be disposed at a same layer as the peripheral connection lines 23 or the conductive connection line 24, so that a single photomask process may be used to form the peripheral connection lines 23, the conductive connection line 24, and the third type signal lines 4 at the same time, which is beneficial to improve the production efficiency of wiring structure and reduce its production cost.

In addition, in the embodiments described above with reference to FIGS. 1 to 5, the conductive blocks 22, the second type signal line 3, and the first type signal lines 2 may be disposed at a same layer, so that a single photomask process may be used to form the conductive blocks 22, the second type signal line 3, and the first type signal lines 2 at the same time, which is beneficial to improve the production efficiency of wiring structure and reduce its production cost.

Figure 6:
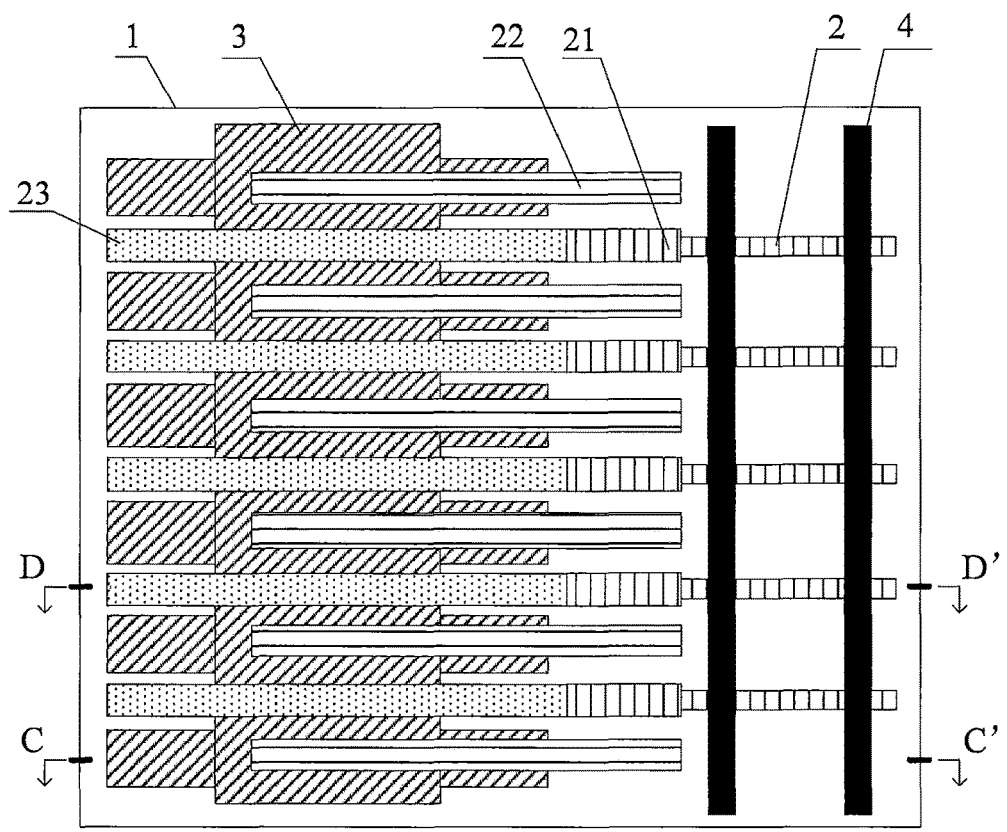
FIG. 6 is a schematic plan view of another wiring structure according to an embodiment of the present disclosure.
Figure 7:
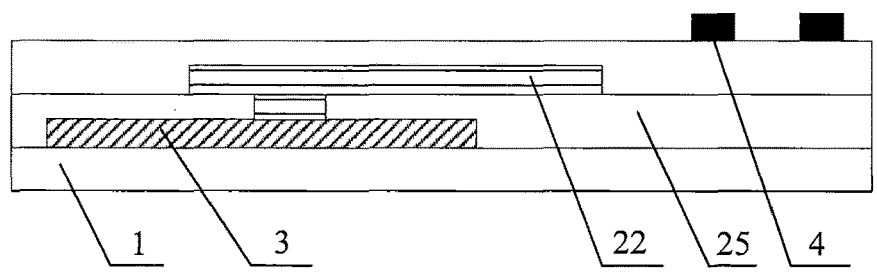
FIG. 7 is a schematic sectional view taken along a line C-C' in FIG. 6.
Figure 8:
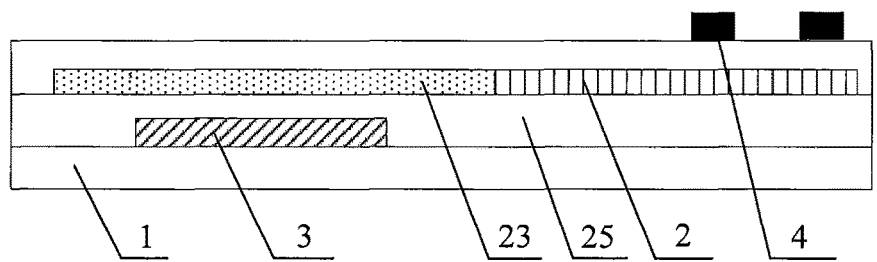
FIG. 8 is a schematic sectional view taken along a line D-D' in FIG. 6.

FIGS. 6 to 8 schematically illustrate another wiring structure according to an embodiment of the present disclosure. Referring to FIGS. 6 to 8, the conductive blocks 22 are disposed at the same layer as the first type signal lines 2, and a first insulating layer 25 is provided between the first type signal lines 2 and the second type signal line 3. That is, the first type signal lines 2 and the second type signal line 3 are on different layers.

Specifically, FIG. 6 more clearly illustrates the connection blocks 21 at the first ends of the first type signal lines 2, and the peripheral connection lines 23 are connected to the corresponding first type signal lines 2 via the corresponding connection blocks 21. In some embodiments, the conductive blocks 22 are connected to the second type signal line 3 through corresponding via holes in the first insulating layer 25, as shown in FIG. 7. In some embodiments, the peripheral connection lines 23 are in the same layer as the first type signal lines 2 and are directly connected to the first type signal lines 2, as shown in FIG. 8. Other embodiments are also contemplated.

Figure 9:
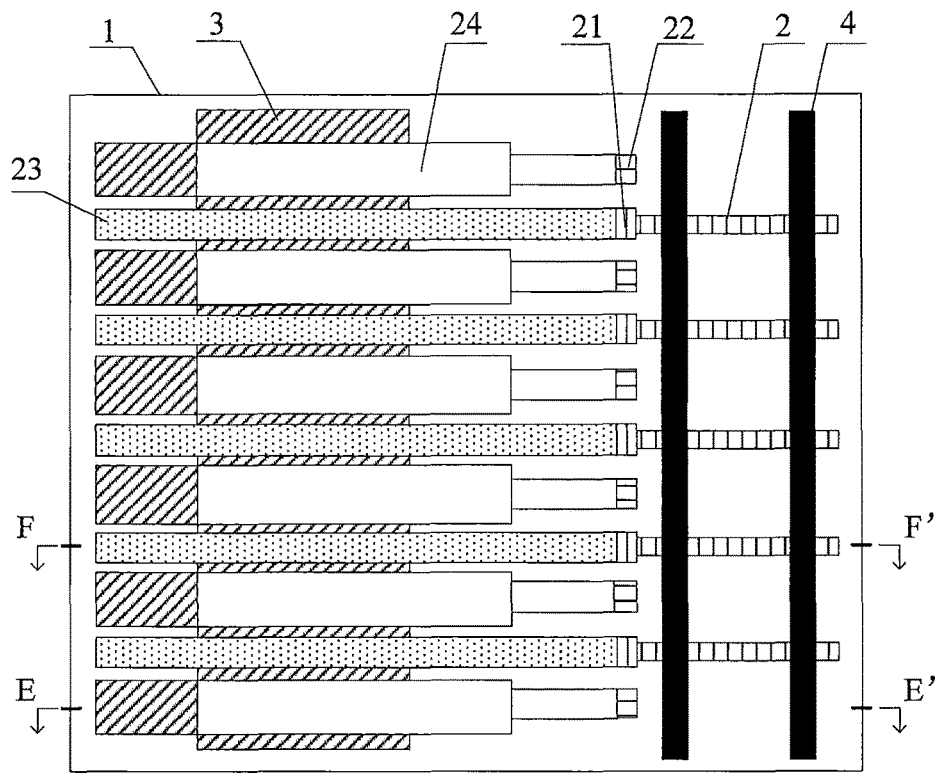
FIG. 9 is a schematic plan view of another wiring structure according to an embodiment of the present disclosure.
Figure 10:
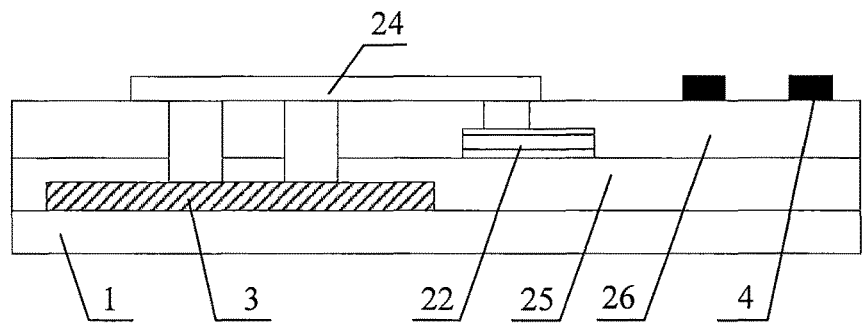
FIG. 10 is a schematic sectional view taken along a line E-E' in FIG. 9.
Figure 11:
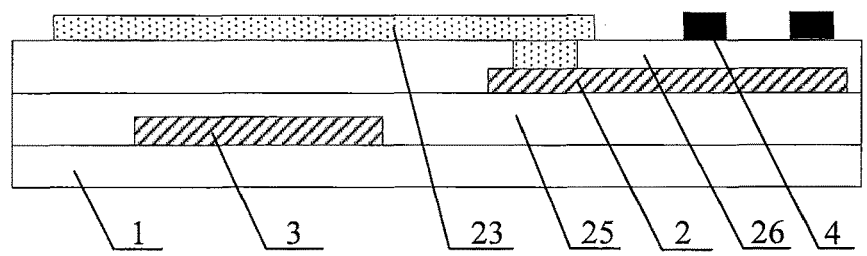
FIG. 11 is a schematic sectional view taken along a line F-F' in FIG. 9.

FIGS. 9 to 11 schematically illustrate another wiring structure according to an embodiment of the present disclosure. Referring to FIGS. 9 to 11, the peripheral connection lines 23 and the first type signal lines 2 are at different layers, and a second insulating layer 26 is provided between the peripheral connection lines 23 and the first insulating layer 25.

Specifically, the conductive connection lines 24 are at the same layer as the peripheral connection lines 23, that is, on the side of the second insulating layer 26 facing away from the base substrate 1. One end of each conductive connection line 24 is connected to the corresponding conductive block 22 through a corresponding via hole penetrating through the second insulating layer 26, and the other end of each conductive connection line 24 is connected to the second type signal line 3 through a via hole penetrating through the second insulating layer 26 and the first insulating layer 25, as shown in FIG. 10. The peripheral connection lines 23 are connected to corresponding first ends of the first type signal lines 2 through corresponding via holes in the second insulating layer 26, as shown in FIG. 11.

A conductive connection line 24 connecting the corresponding conductive block 22 and the second type signal line 3 is provided between each two adjacent peripheral connection lines 23. The conductive connection line 24 may function as a shield line to reduce signal crosstalk between the adjacent peripheral connection lines 23.

In the above embodiment, the peripheral connection lines 23 and the conductive connection line 24 may be parallel to the first type signal lines 2. In this way, it is convenient to perform uniform photolithography on each line to ensure that the edges of each line have a high etching uniformity. This allows a more uniform size deviation of each line, thereby improving fabricating accuracy.

FIGS. 9-11 also show the third type signal lines 4, which may be disposed at the same layer as the peripheral connection lines 23 or the conductive connection line 24 as described above. A detailed description of the third type signal lines 4 is omitted here.

Figure 12:
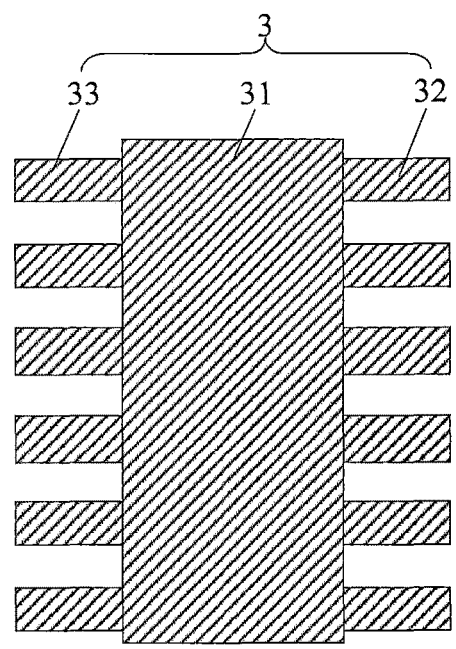
FIG. 12 is a schematic plan view of a second type signal line according to an embodiment of the present disclosure.

FIG. 12 is a schematic plan view of a second type signal line 3 according to an embodiment of the present disclosure. This second type signal line 3 includes a signal line trunk 31 and a plurality of branch portions 32 and 33 that are symmetrical with respect to the signal line trunk 31.

In some embodiments, an orthographic projection of each peripheral connection line 23 on the base substrate 1 is between orthographic projections of two adjacent branch portions 32 or 33 in the second direction (in this example, the vertical direction) on the base substrate 1.

In some embodiments, the branch portions 32 and 33 are strip-shaped and parallel to the first type signal lines 2. The sum of the sizes of the branch portions 32 and 33 and the signal line trunk 31 in the first direction (in this example, the horizontal direction) is approximately equal to the size of the peripheral connection line 23 in the first direction.

By means of such a second type signal line 3, it is possible to ensure that the first type signal lines 2 connected to the corresponding peripheral connection lines 23 have the same or similar parasitic loads, thereby suppressing noise on the first type signal lines 2.

In some embodiments, sizes of the branch portions 32 and 33 in the second direction (in this example, a vertical direction) may be larger than a size of the peripheral connection line 23 in the second direction. In this way, a larger shielding interval may be provided between each two adjacent peripheral connection lines 23, thereby effectively reducing signal crosstalk between the adjacent peripheral connection lines 23.

Figure 13:
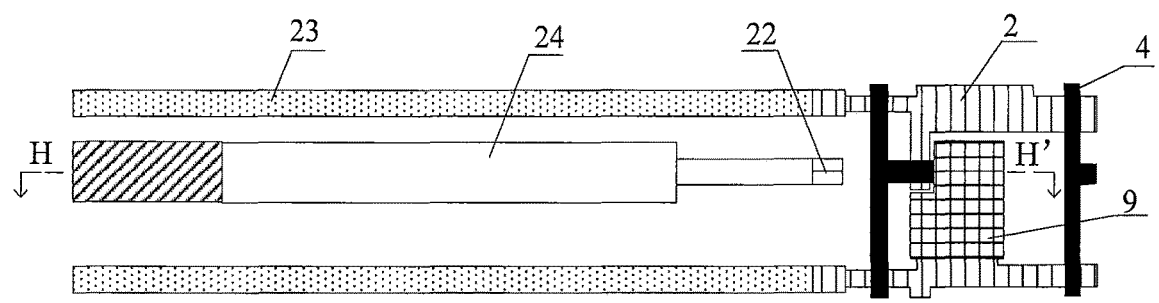
FIG. 13 is a partial schematic view of a display substrate in which the wiring structure of FIG. 4 is applied.

FIG. 13 is a partial schematic view of a display substrate to which the wiring structure of FIG. 4 is applied. In this example, the first type signal line 2 is a gate line, the second type signal line 3 is a common electrode line, and the third type signal line 4 is a data line. As shown in FIG. 13, the data line 4 is connected to a pixel electrode 9.

The display substrate provided by the embodiment of the present disclosure has the same advantages as the embodiment of the wiring structure described above, and will not be described again herein.

Figure 14:
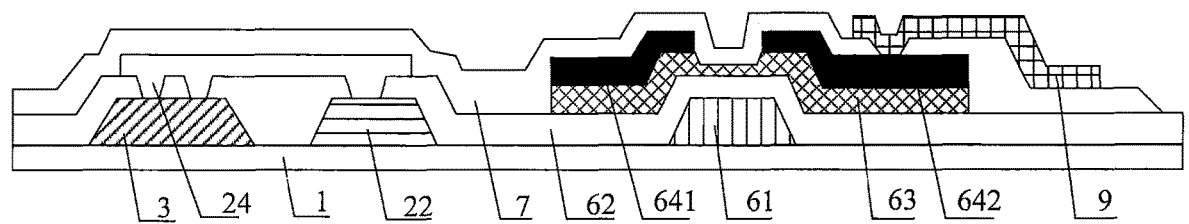
FIG. 14 is a schematic sectional view taken along a line H-H' in FIG. 13.
Figure 15:
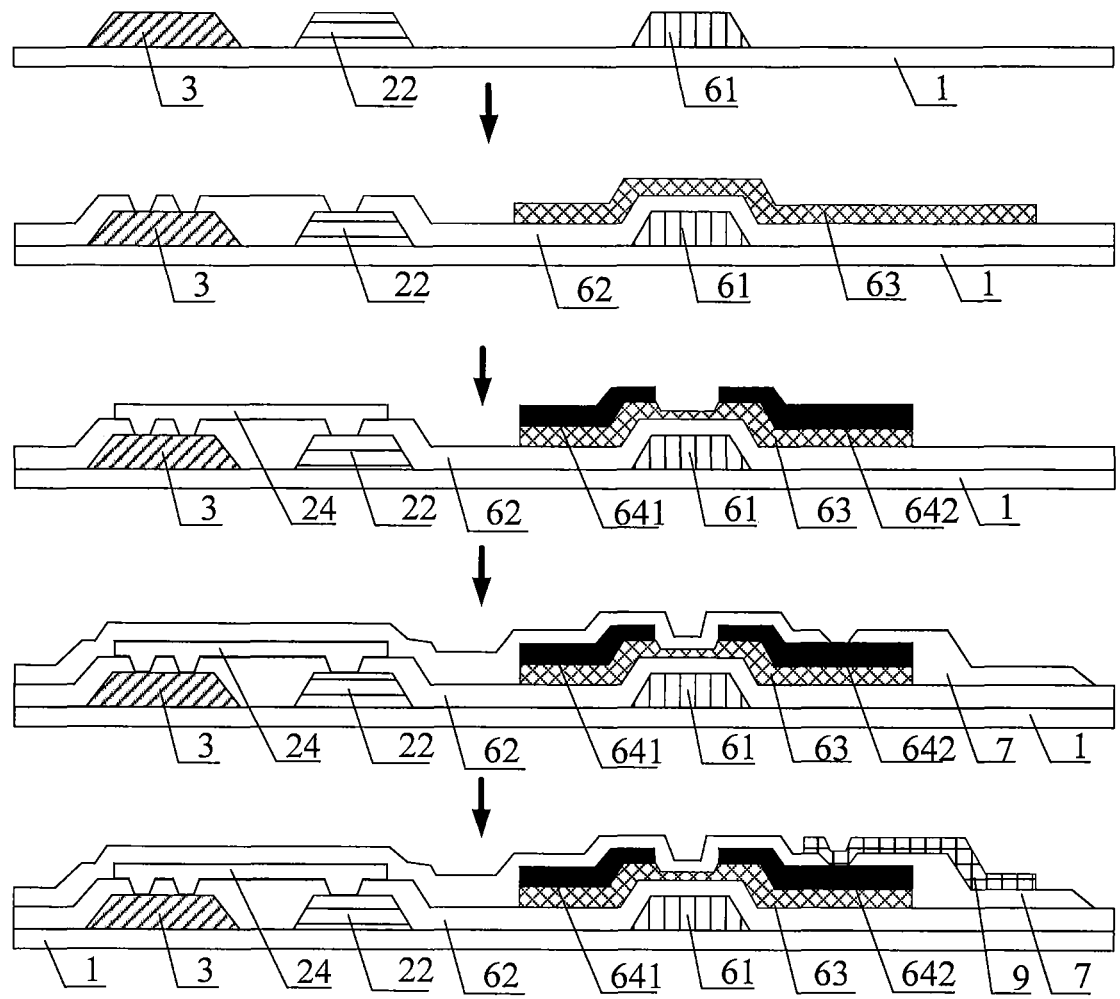
FIG. 15 is a schematic flowchart of a method for fabricating the display substrate shown in FIG. 14.

FIG. 14 is a schematic sectional view taken along a line H-H' in FIG. 13. In this example, the display substrate includes a bottom-gate type thin film transistor including a gate 61, a gate insulating layer 62, an active layer 63, a source 641, and a drain 642. A method for fabricating the display substrate is described below with reference to FIG. 15.

In a first step, a first layer of metal thin film is deposited on the base substrate 1 and the first layer of metal thin film is etched by a photomask process, so that the first layer of metal thin film is patterned to form a first type signal line 2 and the gate 61 of the thin film transistor in the display area, and to form a second type signal line 3 and a conductive block 22 in a frame area.

In some embodiments, the first layer of metal thin film may be made of a metal material having a relatively low resistance, such as aluminum (Al), copper (Cu), molybdenum (Mo), titanium (Ti), or aluminum-neodymium alloy (AlNd), etc. by magnetron sputtering process or evaporation process. In addition, the above-mentioned first layer of metal thin film may be a single-layer metal thin film and may also be a multilayer metal thin film, that is, it is formed by laminating at least two types of metals selected from a group consisting of aluminum (Al), copper (Cu), molybdenum (Mo), and titanium (Ti).

In a second step, a gate insulating layer 62 is formed on the base substrate 1 and the patterned first layer of metal thin film. Through a photomask process, via holes are formed in portions of the gate insulating layer 62 corresponding to the second type signal line 3 and the conductive block 22, and an active layer 63 is formed on a portion of the gate insulating layer 62 opposite to the gate 61.

In some embodiments, the gate insulating layer 62 may be made of materials such as silicon oxide, silicon nitride, or silicon oxynitride, etc. The active layer 63 may be made of materials such as amorphous silicon, microcrystalline silicon, oxide semiconductor, or polysilicon.

In a third step, a second layer of metal thin film is deposited on a portion of the gate insulating layer 62 that is not covered by the active layer 63 and a side of the active layer 63 facing away from the gate insulating layer 62, and the second layer of metal thin film is etched by a photomask process, so that the second layer of metal thin film is patterned to form peripheral connection lines 23, conductive connection lines 24, data lines, and source 641 and drain 642 of the thin film transistor.

In some embodiments, the second layer of metal thin film may be made of a metal material having a relatively low resistance, such as molybdenum (Mo), aluminum (Al), chromium (Cr), copper (Cu), or aluminum-nickel alloy, etc. by magnetron sputtering process or evaporation process.

In a fourth step, a passivation layer 7 is formed on the gate insulating layer 62 and the patterned second layer of metal thin film, and the passivation layer 7 is etched by a photomask process, to form a via hole in a portion of the passivation layer 7 opposite to the drain 642.

In a fifth step, a conductive thin film is formed on a side of the passivation layer 7 facing away from the base substrate 1, and the conductive thin film is etched by a photomask process to form a pixel electrode 9 connected to the drain 642.

In some embodiments, the conductive thin film may be a single-layer conductive thin film formed of a material such as indium tin oxide (ITO) or indium zinc oxide (IZO). Alternatively, the conductive thin film may be a multi-layer conductive thin film formed of materials such as indium tin oxide (ITO) or indium zinc oxide (IZO), such as an indium tin oxide/silver/indium tin oxide (ITO/Ag/ITO) composite thin film, indium zinc oxide/silver (IZO/Ag) composite thin film, etc.

It will be understood that, in the above-mentioned process of etching each functional film layer by the photomask process, the etching equipment, etching method, etching liquid or etching gas used may be selected according to the actual needs of the material, shape and key sizes of the film layer to be etched. The etching equipment used for each functional film layer may be the same or different. When each functional film layer is etched using the same etching equipment, etching of different functional film layers may be accomplished by selecting different etching gases and different gas flow rates.

In some embodiments, the etching of the active layer 63 is generally performed in a plasma chamber with a lower pressure and a higher power in order to achieve a stronger ion bombardment effect and a better sputtering corrosion effect. Insulation thin films and metal thin films are generally performed in a plasma chamber with a higher pressure and a lower power, in order to have a strong chemical corrosion effect. For example, when the above-mentioned gate insulating layer 62 is etched, a plasma chamber having a higher pressure (hundreds of millitorr pressure) and a lower power (less than several kilowatts of power), sulfur hexafluoride (hundreds of sccm), and chlorine (hundreds of sccm) are used for etching. When etching the above-mentioned active layer 63, a plasma chamber having a lower pressure (tens of millitorr pressure) and a higher power (more than several kilowatts of power), sulfur hexafluoride (tens of sccm), and chlorine (thousands of sccm) are used for etching. When dry-etching the above metal thin films, a plasma chamber with a higher pressure (hundreds of millitorr pressure) and a lower power (less than several kilowatts), chlorine (thousands of sccm) and oxygen (thousands of sccm) are used for etching. In addition, the above metal thin films may also be patterned by wet etching. For example, a mixed solution of nitric acid, hydrochloric acid, and acetic acid having a certain concentration ratio is used through immersion and spraying at a temperature of tens of degrees.

Figure 16:
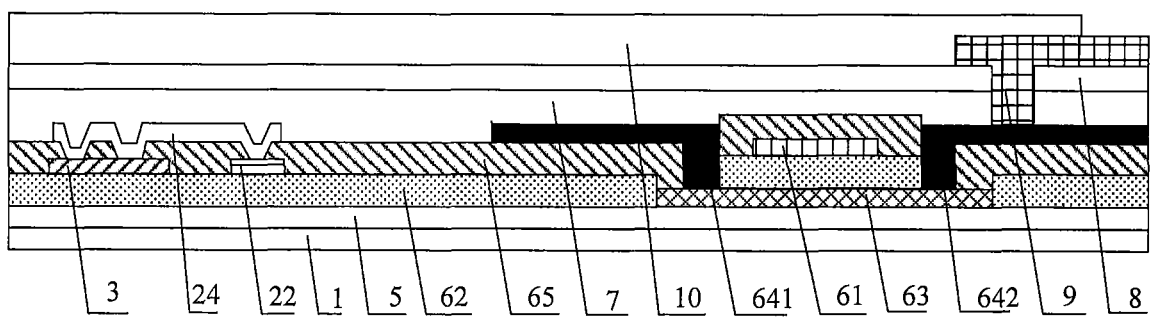
FIG. 16 is another schematic sectional view taken along a line H-H' in FIG. 13.
Figure 17:
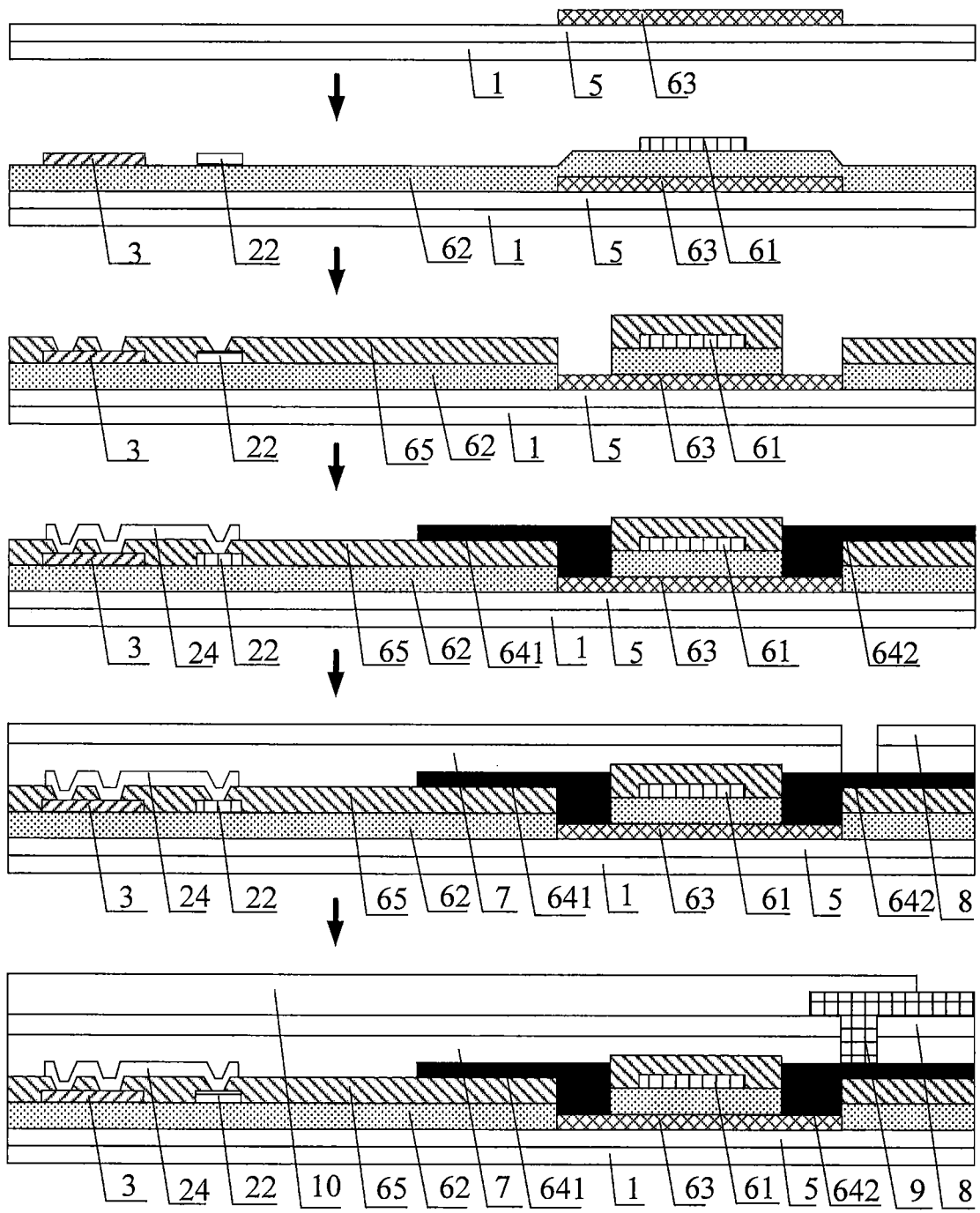
FIG. 17 is a schematic flowchart of a method for fabricating the display substrate shown in FIG. 16.

FIG. 16 is another schematic sectional view taken along a line H-H' in FIG. 13. In this example, the display substrate includes a top-gate thin film transistor including a gate 61, a gate insulating layer 62, an active layer 63, a source 641, and a drain 642. A method for fabricating the display substrate is described below with reference to FIG. 17.

In a first step, a buffer layer 5 and an active layer 63 are formed on the base substrate 1. The active layer 63 is stacked on the buffer layer 5.

In some embodiments, the buffer layer 5 may be formed by laminating a silicon nitride film layer and a silicon dioxide film layer. Specifically, the buffer layer 5 may be formed using a Plasma Enhanced Chemical Vapor Deposition (PECVD) process.

In some embodiments, the active layer 63 may be formed by patterning a polysilicon thin film. The active layer 63 may be formed as follows: forming an amorphous silicon thin film on the surface of the buffer layer 5 facing away from the base substrate 1; performing Excimer Laser Annealing (ELA) or Solid Phase Crystallization (SPC) to the amorphous silicon thin film to obtain a polysilicon thin film; patterning the polysilicon thin film to obtain an active layer 63; and performing ion doping on the conductive channel of the active layer 63 using an ion implantation process.

In a second step, a gate insulating layer 62 is formed on a portion of the buffer layer 5 that is not covered by the active layer 63 and a side of the active layer 63 facing away from the buffer layer 5. A first layer of metal thin film is deposited on a surface of the gate insulating layer 62 facing away from the base substrate 1, and the first layer of metal thin film is etched by a photomask process, so that the first layer of metal thin film is patterned to from the gate 61 and the gate line in the display area, and to form the conductive block 22 and the second type signal line 3 in the frame area.

In some embodiments, the gate insulating layer 62 may be formed of a silicon dioxide film layer. Alternatively, the gate insulating layer 62 may be composed of a stack of silicon nitride and silicon dioxide. Specifically, the gate insulating layer 62 may be formed by using a PECVD process. The first layer of metal thin film described above may be made of a metal material having a relatively low resistance, such as aluminum (Al), copper (Cu), molybdenum (Mo), titanium (Ti), or aluminum-neodymium alloy (AlNd), etc. by magnetron sputtering process or evaporation process.

In a third step, an interlayer insulating layer 65 is formed on a portion of the gate insulating layer 62 that is not covered by the gate 61, the gate line, the conductive block 22, and the second type signal line 3, and is formed on a side of the gate 61, the gate line, the conductive block 22, and the second type signal line 3 facing away from the gate insulating layer 62. Via holes are formed in portions of the interlayer insulating layer 65 and the gate insulating layer 62 that are opposite to the active layer 63, the conductive block 22, and the second type signal line 3.

In some embodiments, the above-mentioned interlayer insulating layer 65 may be composed of a stack of silicon nitride and silicon dioxide. Specifically, the interlayer insulating layer 65 may be formed using a PECVD process.

In a fourth step, a second layer of metal thin film is deposited on a side of the interlayer insulating layer 65 facing away from the base substrate 1, and the second layer of metal thin film is etched by a photomask process, so that the second layer of metal thin film is patterned, to form the source 641 and the drain 642 of the thin film transistor in the display area, and to form the peripheral connection lines 23 and the conductive connection lines 24 in the frame area.

In some embodiments, the above mentioned second layer of metal thin film may be a single-layer metal thin film formed of aluminum (Al), copper (Cu), molybdenum (Mo), titanium (Ti), or aluminum neodymium alloy (AlNd). Alternatively, the second layer of metal thin film may be a multilayer metal thin film formed of aluminum (Al), copper (Cu), molybdenum (Mo), titanium (Ti), or aluminum neodymium alloy (AlNd), such as: molybdenum/aluminum/ Molybdenum (Mo/Al/Mo) thin film, titanium/aluminum/ titanium (Ti/Al/Ti) thin film, etc.

In a fifth step, a passivation layer 7 and a planarization layer 8 are formed sequentially by lamination on the interlayer insulating layer 65 and the patterned second layer of metal thin film using a PECVD process, and through the photomask process, via holes are formed in the portions of the passivation layer 7 and the planarization layer 8 corresponding to the drain 642.

In some embodiments, after the passivation layer 7 and the planarization layer 8 are fabricated, the display substrate may be subjected to a rapid thermal annealing or a heat treatment furnace annealing treatment so as to activate the doped ions of the active layer 63. Then, the active layer 63 is hydrogenated to repair a lattice defect of the active layer 63.

In a sixth step, a conductive thin film is formed on a side of the planarization layer 8 facing away from the base substrate 1, and the conductive thin film is etched through a photomask process to form a pixel electrode 9 connected to the drain 642. A pixel defining layer 10 is formed on a portion of the planarization layer 8 that is not covered by the pixel electrode 9 and a side of the pixel electrode 9 facing away from the planarization layer 8.

In some embodiments, the above-mentioned conductive thin film may be a single-layer conductive thin film formed of a material such as indium tin oxide (ITO) or indium zinc oxide (IZO). Alternatively, the conductive thin film may be a multi-layer conductive thin film formed of materials such as indium tin oxide (ITO) or indium zinc oxide (IZO), such as an indium tin oxide/silver/indium tin oxide (ITO/Ag/ITO) composite thin film, indium zinc oxide/silver (IZO/Ag) composite thin film, etc. The above-mentioned pixel definition layer 10 may be made of the same or similar material as the planarization layer 8.

It will be understood that, although the display substrate is described in FIGS. 13-17 as a display substrate suitable for a liquid crystal display device, this is merely exemplary. In other embodiments, the embodiments of the wiring structure described above are also applicable to display substrates of other types of display devices.

Figure 18:
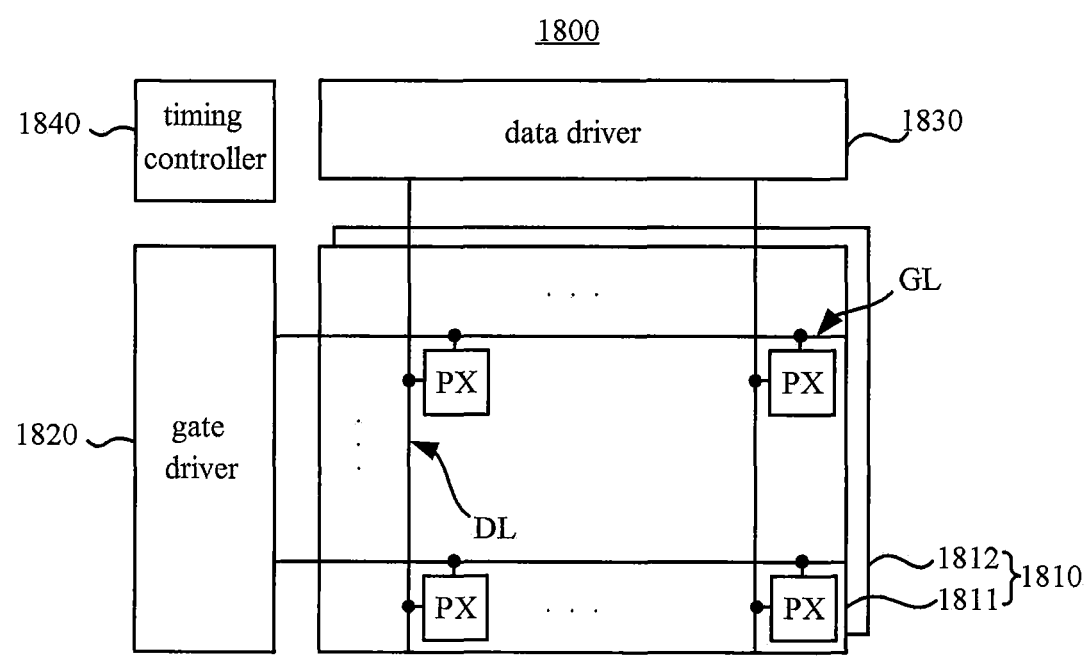
FIG. 18 is a schematic block diagram of a display device according to an embodiment of the present disclosure.

FIG. 18 is a schematic block diagram of a display device 1800 according to an embodiment of the present disclosure. Referring to FIG. 18, the display device 1800 includes a display panel 1810 for displaying an image, a gate driver 1820 for outputting a gate scanning signal to the display panel 1810, a data driver 1830 for outputting a data voltage to the display panel 1810, and a timing controller 1840 for controlling the gate driver 1820 and the data driver 1830.

The display panel 1810 includes a display substrate 1811 and an opposite substrate 1812 opposite to the display substrate 1811. In the case of a liquid crystal display device, the display panel 110 further includes a liquid crystal layer (not shown) between the display substrate 1811 and the opposite substrate 1812, and the opposite substrate 1812 may be a color film substrate. In the case of an organic light emitting diode display device, the opposite substrate 1812 may be a cover plate. The display substrate 1811 includes a plurality of pixel regions PX arranged in an array. Each pixel region PX is at a corresponding intersection of a plurality of gate lines GL and a plurality of data lines DL. Each pixel region includes a pixel including a thin film transistor (not shown) and other associated elements. The display substrate 1811 may take the form of any of the display substrates described above with reference to FIGS. 13-17.

The gate driver 1820 is electrically connected to a first end of each gate line GL, thereby sequentially applying a gate scanning signal to each gate line GL. In some exemplary embodiments, the gate driver 1820 may be directly mounted (e.g., integrated) in the display substrate 1811. Alternatively, the gate driver 1820 may be connected to the display panel 1810 through a Tape Carrier Package (TCP).

The data driver 1830 is electrically connected to a first end of each data line DL to output a data voltage to each data line DL. In some embodiments, the data driver 1830 may include multiple data driving chips operating in parallel.

The timing controller 1840 controls operations of each of the gate driver 1820 and the data driver 1830. Specifically, the timing controller 1840 outputs a data control signal and image data to control the driving operation of the data driver 1830, and outputs a gate control signal to control the driving operation of the gate driver 1820. The data control signal and image data are applied to the data driver 1830. The gate control signal is applied to the gate driver 1820.

The display device 1800 may be any product or component having a display function, such as a mobile phone, a tablet computer, a television, a display, a notebook computer, a digital photo frame, a navigator, and the like. The display device 1800 has the same advantages as those of the above-mentioned embodiments of the wiring structure, and will not be described again herein.

The above are only specific implementations of the disclosure, but the scope of protection of the disclosure is not limited thereto. Any change or replacement that can be easily conceived by those skilled in the art should be covered by the protection scope of the present disclosure. Therefore, the protection scope of the present disclosure shall be subject to the claims.

The invention claimed is:

1. A wiring structure comprising:
a plurality of signal lines on a base substrate, the plurality of signal lines comprising a plurality of first type signal lines extending in a first direction and a second type signal line extending in a second direction crossing the first direction, wherein the second type signal line is at first ends of the plurality of first type signal lines and spaced from the plurality of first type signal lines;
a plurality of conductive blocks, each of which is between first ends of two corresponding adjacent signal lines of the plurality of first type signal lines;
a plurality of peripheral connection lines on a side of the second type signal line facing away from the base substrate;
an insulating layer between the plurality of peripheral connection lines and the first type signal lines and the second type signal line; and
a plurality of conductive connection lines in a same layer as the plurality of peripheral connection lines,
wherein the plurality of conductive blocks are insulated from the plurality of first type signal lines and electrically connected to the second type signal line,
wherein the plurality of first type signal lines, the second type signal line, and the plurality of conductive blocks are in a same layer,
wherein the plurality of peripheral connection lines are connected to corresponding first ends of the plurality of first type signal lines through corresponding via holes in the insulating layer, and
wherein the plurality of conductive connection lines are connected to the second type signal line and the plurality of conductive blocks through corresponding via holes in the insulating layer.

2. The wiring structure according to claim 1, wherein the plurality of conductive blocks are directly connected to the second type signal line.

3. The wiring structure according to claim 1, further comprising:
a first insulating layer between the plurality of first type signal lines and the second type signal line,
wherein the plurality of conductive blocks are in a same layer as the plurality of first type signal lines.

4. The wiring structure according to claim 3, further comprising:
a plurality of peripheral connection lines on a side of the first insulating layer facing away from the base substrate,
wherein the plurality of peripheral connection lines are connected to corresponding first ends of the plurality of first type signal lines.

5. The wiring structure according to claim 4, wherein the plurality of peripheral connection lines are in the same layer as the plurality of first type signal lines and are directly connected to the plurality of first type signal lines.

6. The wiring structure according to claim 4, wherein the plurality of conductive blocks are connected to the second type signal line through corresponding via holes in the first insulating layer.

7. The wiring structure according to claim 1,
wherein the plurality of signal lines further comprise a plurality of third type signal lines that cross the plurality of first type signal lines and are insulated from the plurality of first type signal lines, and
wherein the plurality of third type signal lines are in a same layer as the plurality of peripheral connection lines.

8. The wiring structure according to claim 1,
wherein the second type signal line comprises a signal line trunk extending along the second direction and a plurality of branch portions symmetrical with respect to the signal line trunk, and
wherein an orthographic projection of each of the plurality of peripheral connection lines on the base substrate is between orthographic projections of adjacent corresponding branch portions in the second direction of the plurality of branch portions on the base substrate.

9. The wiring structure according to claim 8,
wherein each of the plurality of branch portions has a first size in the second direction,
wherein each of the plurality of peripheral connection lines has a second size in the second direction, and
wherein the first size is larger than the second size.

10. The wiring structure according to claim 1, wherein the plurality of peripheral connection lines and the plurality of conductive connection lines are parallel to the plurality of first type signal lines.

11. The wiring structure according to claim 1, wherein the plurality of first type signal lines, the second type signal line, and the plurality of conductive blocks comprise at least one selected from a group consisting of an aluminum film, a copper film, a molybdenum film, a titanium film, a chromium film, an aluminum neodymium alloy film, and an aluminum nickel alloy film.

12. A display substrate comprising a base substrate and the wiring structure according to claim 1.

13. The display substrate according to claim 12,
wherein the plurality of first type signal lines are selected from a group consisting of gate lines and data lines, and
wherein the second type signal line is selected from a group consisting of a common electrode line, a clock signal line, a positive voltage signal line, a negative voltage signal line, and an auxiliary discharge line.

14. A display device comprising the display substrate according to claim 12.

15. A method for fabricating the display substrate according to claim 12, wherein the display substrate further comprises a bottom-gate thin film transistor, and the bottom-gate thin film transistor comprises a gate, a gate insulating layer, an active layer, and a source and a drain, the method comprising:
- patterning a first layer of metal thin film on the base substrate to form the plurality of first type signal lines and the gate in a display area of the display substrate, and to form the second type signal line and the plurality of conductive blocks in a frame area of the display substrate;
- forming the gate insulating layer on the base substrate and the first layer of metal thin film that was patterned;
- forming the active layer on a portion of the gate insulating layer opposite to the gate; and
- patterning a second layer of metal thin film on a portion of the gate insulating layer that is not covered by the active layer and a side of the active layer facing away from the gate insulating layer to form the source and the drain in the display area, and electrically connecting the plurality of conductive blocks to the second type signal line.

16. A wiring structure comprising:
- a plurality of signal lines on a base substrate, the plurality of signal lines comprising a plurality of first type signal lines extending in a first direction and a second type signal line extending in a second direction crossing the first direction, wherein the second type signal line is at first ends of the plurality of first type signal lines and spaced from the plurality of first type signal lines; and
- a plurality of conductive blocks, each of which is between first ends of two corresponding adjacent signal lines of the plurality of first type signal lines,
- a first insulating layer between the plurality of first type signal lines and the second type signal line,
- a plurality of peripheral connection lines on a side of the first insulating layer facing away from the base substrate,
- a second insulating layer between the plurality of peripheral connection lines and the first insulating layer; and
- a plurality of conductive connection lines in a same layer as the plurality of peripheral connection lines,
- wherein the plurality of conductive blocks are insulated from the plurality of first type signal lines and electrically connected to the second type signal line,
- wherein the plurality of conductive blocks are in a same layer as the plurality of first type signal lines,
- wherein the plurality of peripheral connection lines are connected to corresponding first ends of the plurality of first type signal lines,
- wherein the plurality of peripheral connection lines are connected to corresponding first ends of the plurality of first type signal lines through corresponding via holes in the second insulating layer, and
- wherein a first end of each of the plurality of conductive connection lines is connected to a corresponding one of the plurality of conductive blocks through a corresponding via hole penetrating through the second insulating layer, and a second end of each conductive connection line is connected to the second type signal line through corresponding via holes penetrating through the first insulating layer and the second insulating layer.

17. A method for fabricating a display substrate, the display substrate comprising a base substrate and a wiring structure, and the wiring structure comprising a plurality of signal lines on a base substrate, the plurality of signal lines comprising a plurality of first type signal lines extending in a first direction and a second type signal line extending in a second direction crossing the first direction, wherein the second type signal line is at first ends of the plurality of first type signal lines and spaced from the plurality of first type signal lines; and a plurality of conductive blocks, each of which is between first ends of two corresponding adjacent signal lines of the plurality of first type signal lines, wherein the plurality of conductive blocks are insulated from the plurality of first type signal lines and electrically connected to the second type signal line, and wherein the display substrate further comprises a top-gate thin film transistor, and the top-gate thin film transistor comprises a gate, a gate insulating layer, an active layer, and a source and a drain, the method comprising:
- forming a buffer layer and the active layer on the base substrate, wherein the active layer is stacked on the buffer layer;
- forming the gate insulating layer on a portion of the buffer layer that is not covered by the active layer and a side of the active layer facing away from the buffer layer;
- patterning a first layer of metal thin film on a side of the gate insulating layer facing away from the base substrate to form the gate and the plurality of first type signal lines in a display area of the display substrate, and to form the second type signal line and the plurality of conductive blocks in a frame area of the display substrate;
- forming an interlayer insulating layer on the gate insulating layer; and
- patterning a second layer of metal thin film on the interlayer insulating layer to form the source and the drain in the display area, and electrically connecting the plurality of conductive blocks to the second type signal line.

* * * * *